(12) United States Patent
Chien (10) Patent No.: US 6,396,685 B1
(45) Date of Patent: May 28, 2002

(54) STRUCTURE FOR ADJUSTABLY PRESSING INTERFACE CARDS AGAINST CARD SLOTS

(76) Inventor: Yung-Chih Chien, No. 87-3, Sec. 1, Chung-Hwa Rd., Pa Li Hsiang, Taipei Hsien (TW)

( * ) Notice: Subject to any disclaimer, the term of this patent is extended or adjusted under 35 U.S.C. 154(b) by 0 days.

(21) Appl. No.: 09/711,149

(22) Filed: Nov. 14, 2000

(51) Int. Cl.⁷ .................................................. G06F 1/16
(52) U.S. Cl. ..................... 361/683; 361/796; 312/223.2
(58) Field of Search ................................ 361/391, 415, 361/730, 732, 740, 752, 754, 756, 759, 796–802, 825, 683; 312/7.1, 190, 215, 216, 223.1, 223.2, 223.3, 265.5, 265.6, 293.3; 211/40, 41, 41.17, 181, 184; 339/17 M, 17 LM, 75 MP; 248/27.1, 27.3

(56) References Cited

U.S. PATENT DOCUMENTS

| | | | | |
|---|---|---|---|---|
| 3,829,741 A | * | 8/1974 | Athey | 317/101 DH |
| 3,863,113 A | * | 1/1975 | Ward | 317/101 DH |
| 4,716,495 A | * | 12/1987 | Craker | 361/391 |
| 5,402,319 A | * | 3/1995 | Shumaker et al. | 361/96 |
| 6,309,037 B2 | * | 10/2001 | Bertolami | 312/223.2 |
| 6,320,760 B1 | * | 11/2001 | Flamm et al. | 361/801 |

* cited by examiner

Primary Examiner—Lynn D. Feild
Assistant Examiner—Yean-Hsi Chang
(74) Attorney, Agent, or Firm—Rosenberg, Klein & Lee (57) ABSTRACT

A structure for adjustably pressing interface cards against card slots provided in a computer case is provided. The structure includes a main support transversely mounted on and between two side walls of the case to locate above the card slots, at least one pressing plate detachably connected at an upper end to one side of the main support to pass below the main support, at least one leaf spring having a lower end fixedly connected to a lower side of the pressing plate and an upper end detachably connected to a top of the main support above the upper portion of the pressing plate, and a plurality of adjusting device spaced on the support corresponding to the card slots. By aligning the pressing plate and the leaf spring connected thereto with one adjusting device and turning the adjusting device downward, a lower portion of the pressing plate is elastically pushed by the adjusting device to firmly press an interface card below the adjusting device against the card slot.

5 Claims, 7 Drawing Sheets

STRUCTURE FOR ADJUSTABLY PRESSING INTERFACE CARDS AGAINST CARD SLOTS

FIELD OF THE INVENTION

The present invention relates to a structure for adjustably pressing interface cards against card slots provided in a computer case, and more particularly to a structure having adjustable pressing plates for pressing against interface cards of any specification, so that the latter are securely located in the card slots.

BACKGROUND OF THE INVENTION

It is a common experience of many computer users that a computer unexpectedly shuts down during operating. A reason for such unexpected shutdown is the computer is vibrated during transportation or operation to result in loosened and therefore poorly connected interface card or cards that should be firmly inserted in card slot or slots. A shock-resistant pressing bar has been developed for firmly pressing interface cards against their card slots and mainly includes a supporting frame transversely mounted in a computer case with two ends thereof fixed to two side walls of the case. The supporting frame is provided along two longitudinal sides with a plurality of locating holes, so that pressing plates may be connected to the supporting frame by means of screws extended through the locating holes. Since the interface cards have different specifications and accordingly, different heights and lengths, the pressing plates must be differently designed to correspond to different interface cards. This will increase costs for making different dies for the pressing plates. Moreover, since the locating holes on the supporting frame are not adjustable, it is possible the pressing plates could not be mounted onto the supporting frame via the locating holes simply because of very small error in their dimensions.

Figure 1:
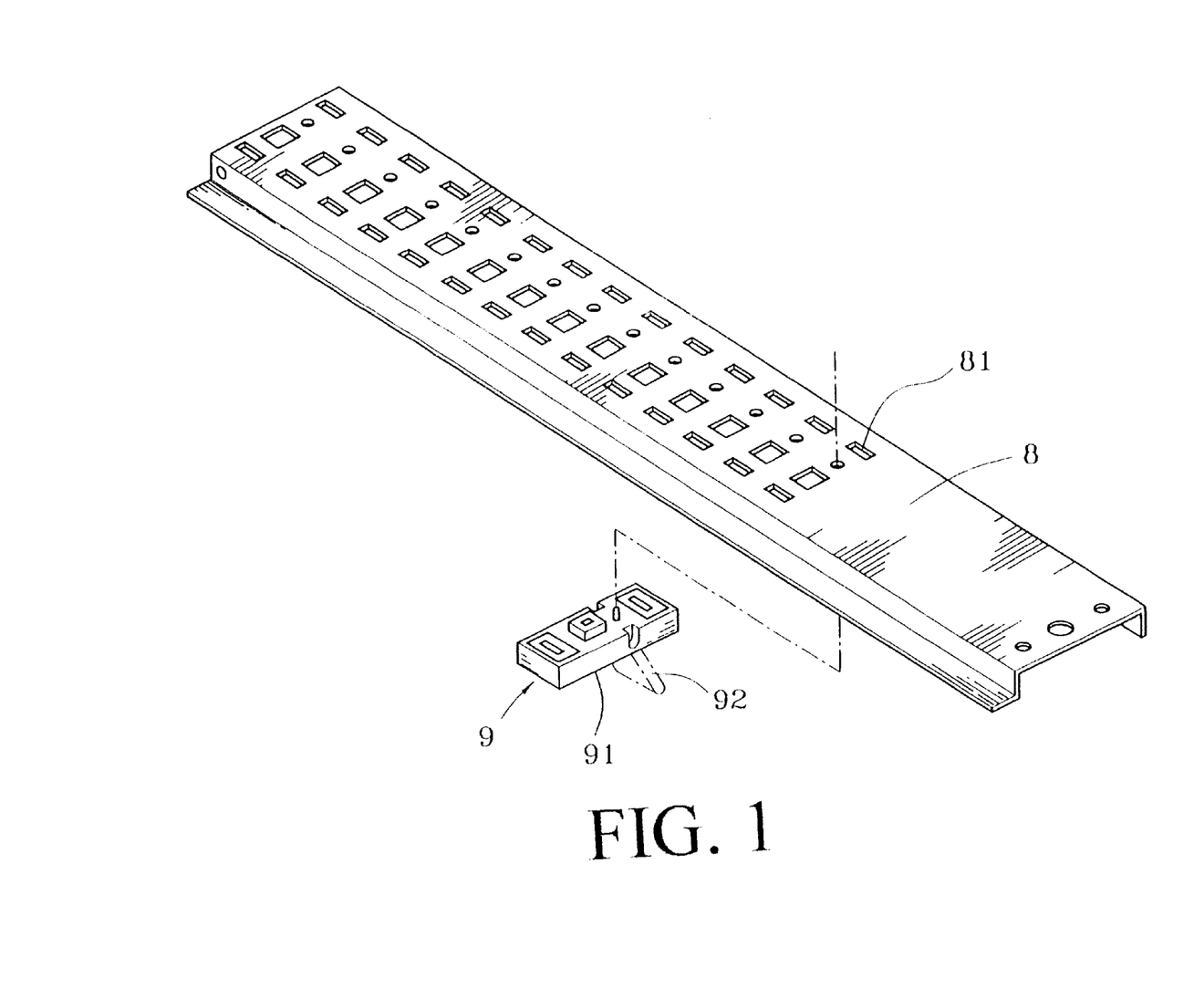
FIG. 1 is an exploded perspective of a conventional pressing means and a supporting frame thereof for pressing an interface card against its card slot.

Taiwan New Utility Model Publication No. 347103 discloses a pressing means 9 for computer interface cards, as illustrated in FIG. 1. The pressing means 9 is detachably connected to one of many fixing means provided on a supporting frame 8 that is transversely mounted on and between two side walls of a computer case. The pressing means 9 each includes a protruded stub 91 for engaging with a mounting hole 81 on the supporting frame 8 and a pressing bar 92 that could be set to first and second positions depending on the height of an interface card to be pressed by the pressing means 9. Such type of pressing means 9 has the following disadvantages:

1. The pressing means 9 could be used to press only two predetermined types of interface cards, that is, a high interface card and a low interface card, against their card slots. There is not fine-adjustment means on the pressing means 9 to allow an interface card having a height other than the two predetermined heights to fitly locate between a card slot and the pressing means 9.
2. The pressing means 9 has complicate structure and could not be easily assembled. The stub 91 is engaged into one mounting hole 81 on the supporting frame 8 without the possibility of being sideward adjusted to offset minor error in dimension or position of the pressing means 9.
3. Whenever a user needs to replace an interface card, the pressing means 9 must be dismounted from the supporting frame 8 to allow dismounting of the interface card from its card slot. And, the pressing means 9 must be mounted again when the new interface card has been installed in the card slot. Such dismounting and mounting of the pressing means 9 would cause a lot of troubles to the user.

SUMMARY OF THE INVENTION

It is therefore a primary object of the present invention to provide a structure for adjustably pressing interface cards against their card slots, in which pressing plates thereof are vertically and horizontally adjustable for securely pressing interface cards of different specifications against their card slots.

Another object of the present invention is to provide a structure for adjustably pressing interface cards against their card slots, in which a main support thereof is pivotally connected at one end to a side wall of a computer case via a hinge and detachably connected at another end to another side wall of the computer case via a screw, such that the main support could be easily pivotally lifted about the hinge to allow a user to conveniently access and dismount an interface card from the card slot.

A further object of the present invention is to provide a structure for adjustably pressing interface cards against their card slot, in which a cooling fan could be mounted on a main support thereof to speed radiation of heat produced by the interface cards during operation, so as to ensure normal operation of the interface cards for a prolonged time.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2:
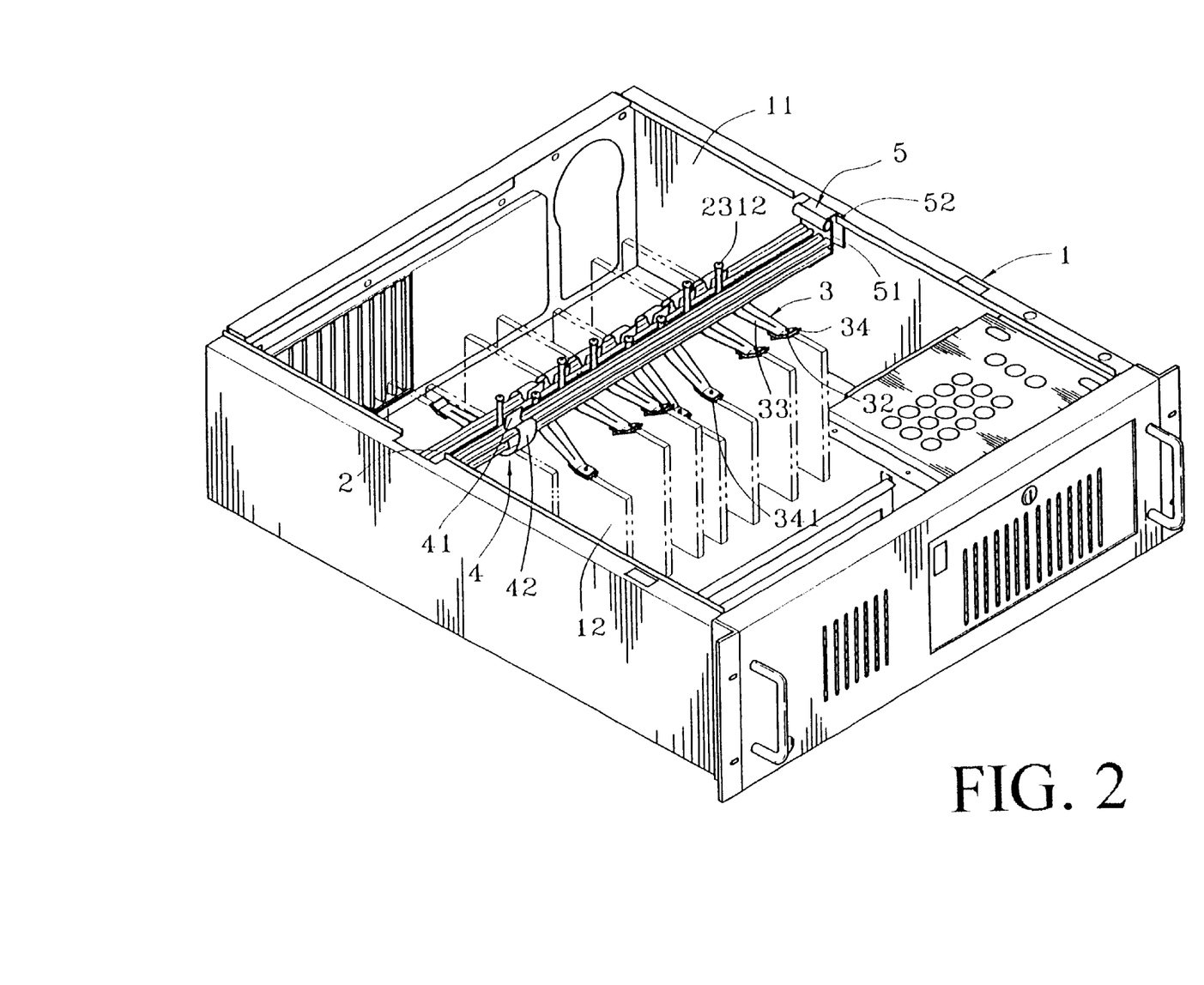
FIG. 2 is a perspective view of a structure of the present invention for pressing interface cards against their card slots in a computer case.
Figure 3:
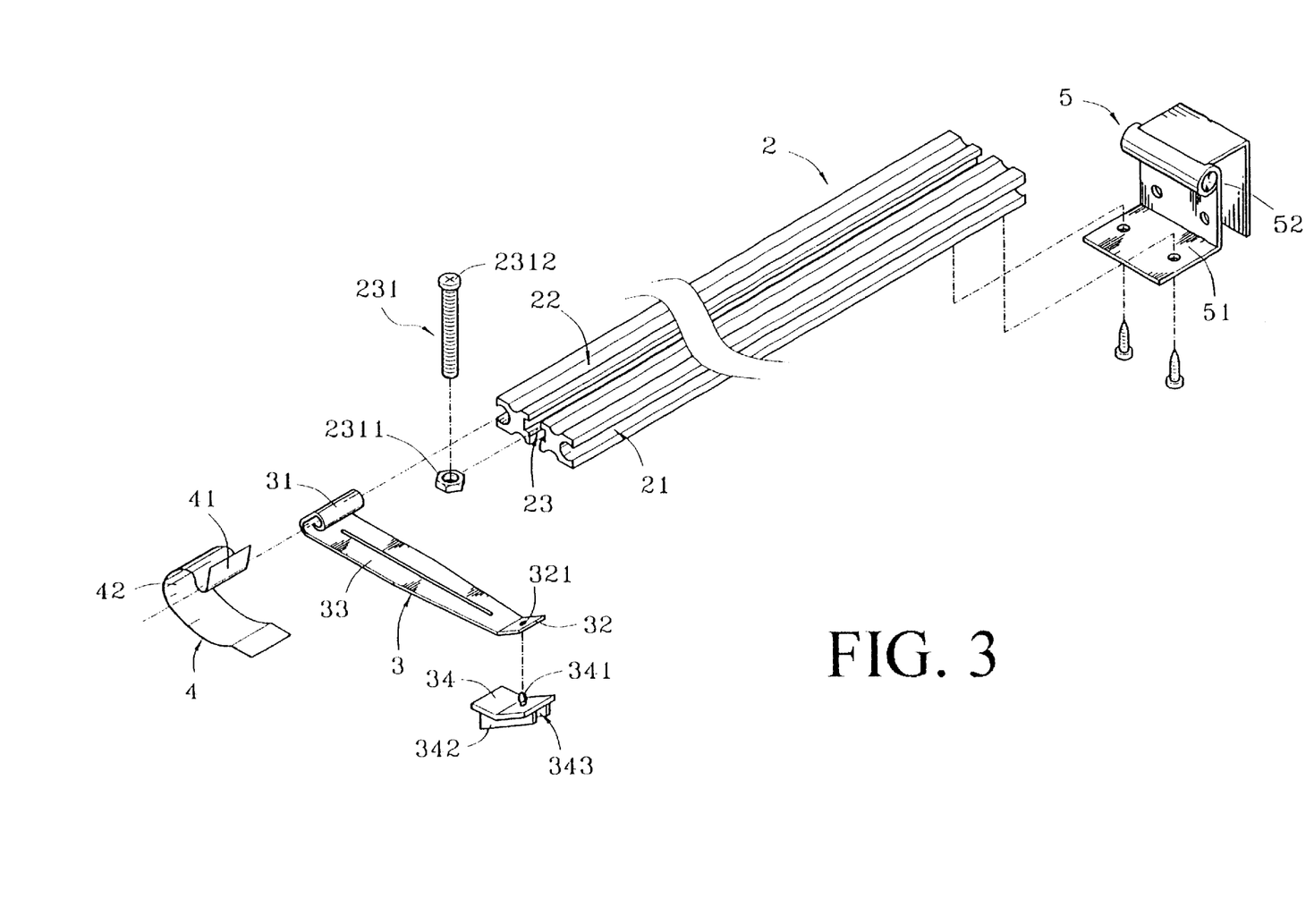
FIG. 3 is an exploded perspective of the structure of the present invention showing major components thereof.

Please refer to FIGS. 2 and 3 that are assembled and exploded perspective views, respectively, of a structure according to an embodiment of the present invention for adjustably pressing interface cards against their card slots. As shown, the structure mainly includes a main support 2 transversely mounted in a computer case 1 above card slots (not shown) provided in the case 1, at least one pressing plate 3 detachably connected to the support 2, and at least one leaf spring 4 connected at a lower end to the pressing plate 3 and at an upper end 41 to the main support 2.

Figure 4A:
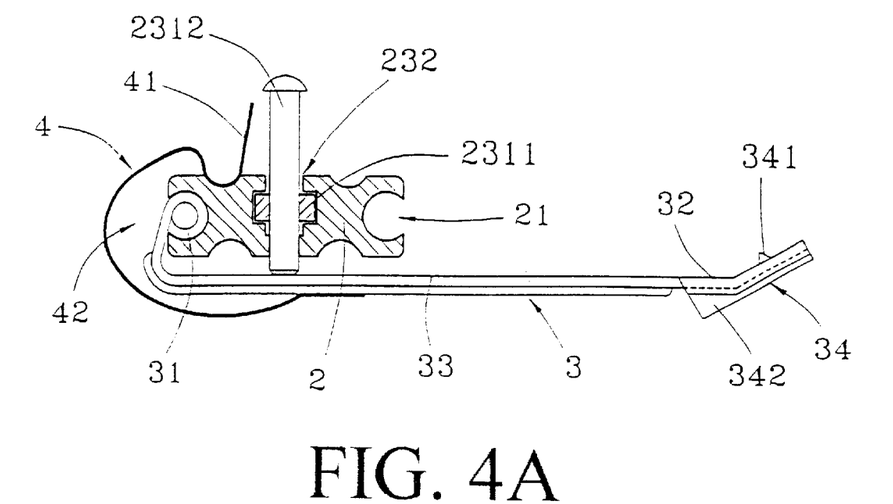
FIGS. 4A and 4B show the manner of assembling the major components of the present invention.
Figure 4B:
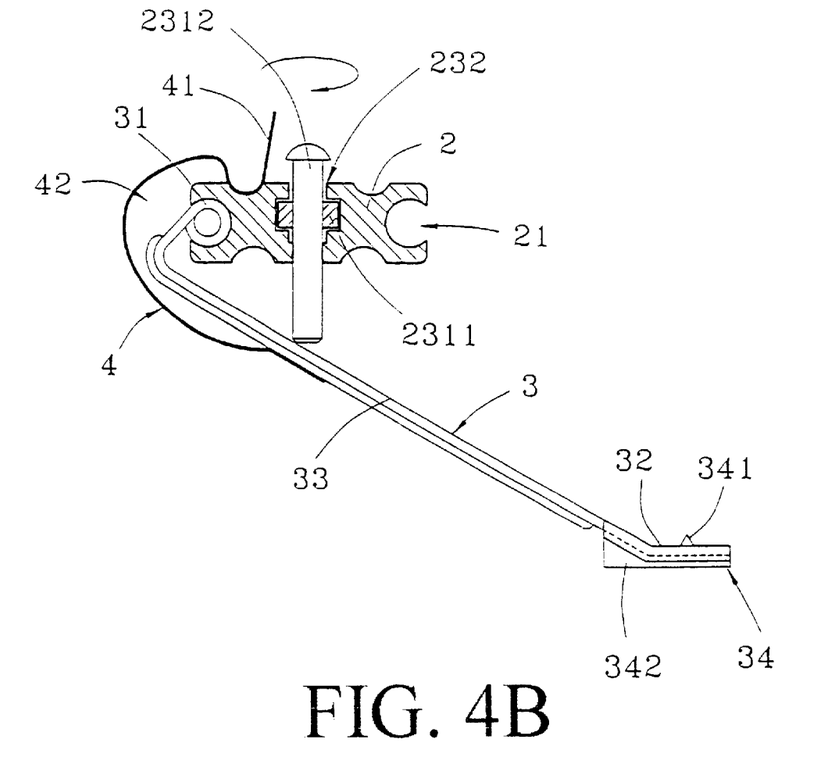
Figure 5:
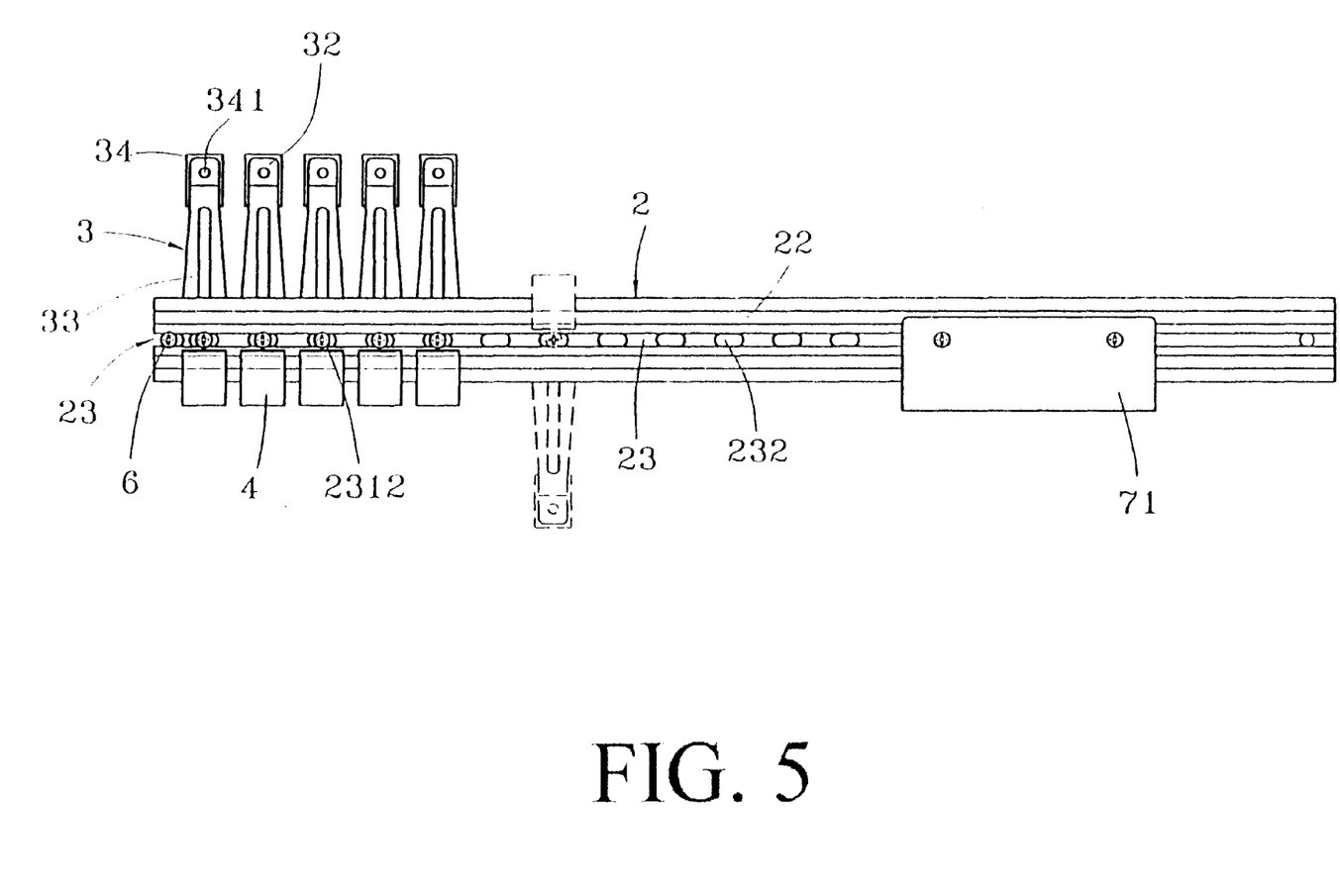
FIG. 5 is a top view of the structure of the present invention, in which a cooling fan is mounted on a main support thereof.

The main support 2 is pivotally connected at one end to one side wall 11 of the case 1 via a hinge 5 and detachably connected at another end to another side wall 11 of the case 1 by fastening means, such as a screw 6 (see FIG. 5). The hinge 5 includes two connecting leaves 51 separately connected to the main support 2 and the side wall 11 of the case 1, and a pivotal pin 52 pivotally connecting the two leaves 51 to each other. As can be seen from FIGS. 2, 3, 4A and 4B, the main support 2 is formed along two longitudinal sides with two displacement channels 21, at a top close and parallel to the two displacement channels 21 with two fixing channels 22, and at a top center with an axially extended adjusting channel 23. A plurality of through holes 232 are provided in the adjusting channel 23 separately corresponding to card slots provided in the case 1 for each receiving an adjusting means 231 therein. Each adjusting means 231 includes a nut 2311 mounted in the adjusting channel 23 in alignment with one through hole 232 and an adjusting screw 2312 downward extended through the nut 2311 and accordingly, the through hole 232.

The pressing plate 3 includes an upper portion 31 movably received in one of the two displacement channels 21, a middle portion 33 extended from the upper portion 31 to pass below the main support 2, and a lower portion 32 extended from the middle portion 33 to bend upward at a predetermined point. The lower portion 32 of the pressing plate 3 is provided with a hole 321 for engaging with a stub 341 provided on an upper side of a pressing head 34. The pressing head 34 is provided at a lower side with two projections 342, so that an engaging slot 343 is defined between the two projections 342. The engaging slot 343 has a width corresponding to that of an interface card 12.

The leaf spring 4 includes a lower end fixedly connected to a lower side of the middle portion 33 of the pressing plate 3, an upper end 41 adapted to fit in one of the two fixing channels 22 adjacent to the displacement channel 21 having the upper portion 31 of the pressing plate 3 received therein, and a curved elastic section 42 between the upper and the lower ends of the leaf spring 4 to provide a predetermined spring force for normally pushing the pressing plate 3 toward the main support 2.

Figure 6:
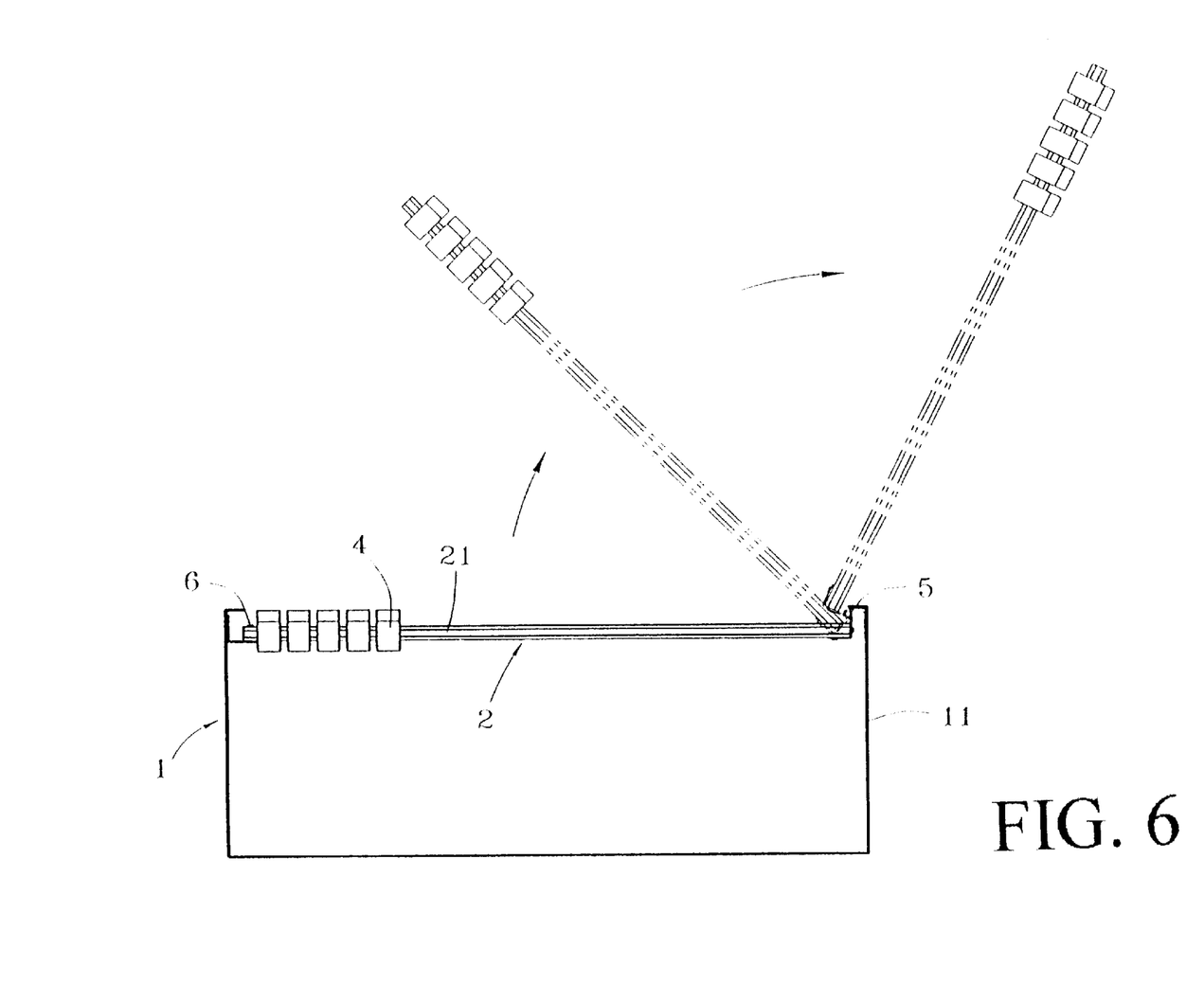
FIG. 6 shows the manner of lifting the main support in the structure of the present invention to facilitate mounting or replacing of interface cards in the computer case.

Please now refer to FIGS. 2, 4A and 4B. To mount a pressing plate 3 on the main support 2 for firmly pressing a specific interface card 12 against its card slot, first loosen the screw 6 at one end of the main support 2 to pivotally lift the same about the pivotal pin 52 of the hinge 5, as shown in FIG. 6, so that there is sufficient space in the case 1 for a user to mount or replace the specific interface card 12 in its card slot. Then, a pressing plate 3 is connected to the main support 2 by engaging the upper portion 31 of the pressing plate 3 into one of the displacement channels 21, depending on a length of the specific interface card 12. The pressing plate 3 is then moved along the displacement channel 21 to a point above the specific interface card 12 with the upper end 41 of the leaf spring 4 connected thereto fitted in the fixing channel 22 adjacent to the displacement channel 21 with which the pressing plate 3 is engaged. If there are other interface cards 12 to be mounted or replaced in the card slots in the case 1, repeat the above steps to mount other pressing plates 3 and leaf springs 4 on the main support 2 correspondingly to the interface cards 12. After all the pressing plates 3 and the leaf springs 4 are duly mounted, downward turn the main support 2 about the pivotal pin 52 and use the screw 6 to fasten another end of the main support 2 to the side wall 11 of the case 1 again. Thereafter, turn the adjusting screw 2312 of the adjusting means 231 in the through hole 232 that corresponds to one interface card 12 and accordingly, one pressing plate 3, so that a lower end of the adjusting screw 2312 is downward moved to push against an upper side of the middle portion 33 of the pressing plate 3. With a downward pressure from the adjusting screw 2312 and an upward spring force from the elastic section 42 of the leaf spring 4, the lower portion 32 of the pressing plate 3 is gradually brought to a position close to a top of the corresponding interface card 12. After the engaging slot 343 of the pressing head 34 below the lower portion 32 of the pressing plate 3 is accurately aligned with the interface card 12, the adjusting screw 2312 is further screwed into the through hole 232 to cause the pressing head 34 to securely press against the interface card 12 with the top of the interface card 12 being restricted in the engaging slot 343.

In the structure of the present invention, the through hole 232 has a predetermined adjusting length that allows the adjusting means 231 to move in the adjusting channel 23 to a desired position. This adjusting length of the through hole 232 and the movable engagement of the pressing plate 3 and the leaf spring 4 with the main support 2 ensures fully accurate alignment of the pressing head 34 with the corresponding interface card 12 to firmly press the latter against its card slot.

From the above description, it is known that the structure of the present invention is adapted to simultaneously press interface cards of different specifications against their card slots. In the event any pressing plate 3 is damaged or in the event there is any interface card 12 to be added into the case 1, the user needs only to buy at very low cost a new pressing plate 3 and the leaf spring 4 to replace the damaged one with the new one by following the above described steps.

Figure 7:
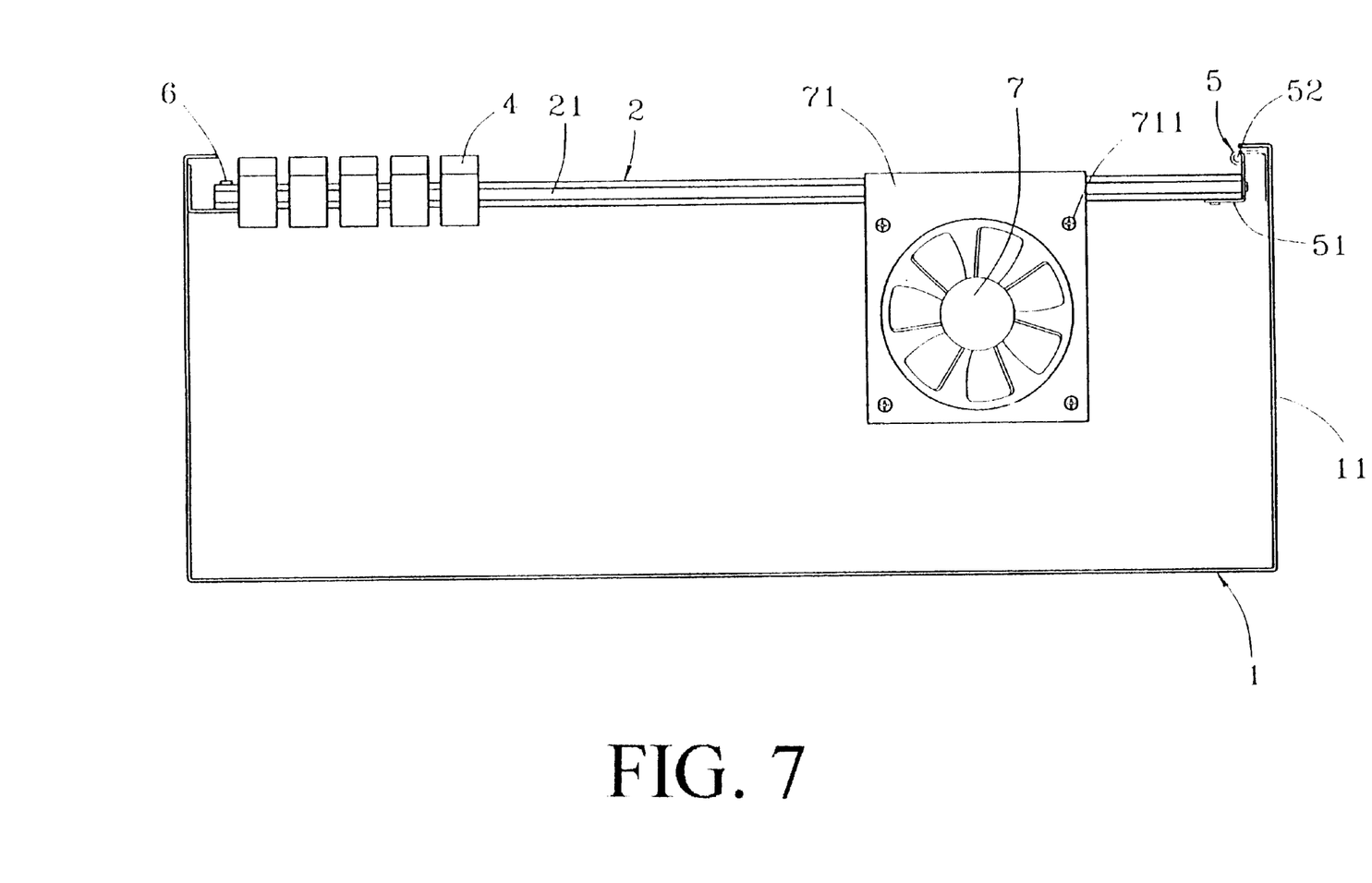
FIG. 7 is a schematic elevational view of the structure of the present invention, in which a cooling fan is mounted on the main support thereof.

FIG. 7 illustrates another embodiment of the present invention. In this embodiment, a cooling fan 7 is additionally mounted on the main support 2. The cooling fan 7 includes a mounting plate 71 on which mounting holes 711 are provided. As can be seen from FIG. 5, the mounting plate 71 is positioned on the top of the main support 2 at a predetermined place with the mounting holes 711 aligned with adjusting means 231 in the adjusting channel 23, so that the cooling fan 7 is connected to the main support 2 by extending the adjusting screws 2312 through the mounting holes 711 before screwing into the nuts 2311. The cooling fan 7 operates to create air convection in the case 1, so that heat produced by the operating interface cards 12 is constantly removed from the case 1 to ensure normal operation of the interface cards 12 for a prolong time.

The present invention has been described with preferred embodiments thereof and it is understood that many changes and modifications in the described embodiments can be carried out without departing from the scope and the spirit of the invention that is intended to be limited only by the appended claims.

What is claimed is:

1. A structure for adjustably pressing interface cards against card slots in a computer case, comprising:

a main support being transversely mounted on and between two side walls of said computer case to locate above said card slots; said main support being formed along two longitudinal sides with two displacement channels, at a top close and parallel to said two displacement channels with two fixing channels, and at a top center with an axially extended adjusting channel; and said adjusting channel being provided therein with a plurality of through holes corresponding to said interface card slots to each receive an adjusting means therein;

at least one pressing plate being detachably connected to said support, said pressing plate including an upper portion movably engaged with one of said two displacement channels, an upward bent lower portion, and a middle portion between said upper and said lower portions to extend below said main support; and at least one leaf spring having a lower end fixedly connected to a lower side of said middle portion of said pressing plate, an upper end detachably engaged in one said fixing channel on the top of said main support adjacent to said displacement channel with which said upper portion of said pressing plate is engaged, and a curved elastic section between said upper and said lower ends of said leaf spring to provide a predetermined spring force to normally push said pressing plate toward said main support; and said adjusting means in each said through hole in said adjusting channel on said main support being adapted to move downward to push said pressing plate downward until said lower portion of said pressing plate firmly presses an interface card corresponding to said adjusting means against said card slot for said interface card.

2. A structure for adjustably pressing interface cards against card slots as claimed in claim 1, wherein said main support is pivotally connected at one end to one said side wall of said computer case through a hinge.

3. A structure for adjustably pressing interface cards against card slots as claimed in claim 1, wherein said lower portion of said pressing plate has a pressing head connected to a bottom thereof, said pressing head being provided at an upper side with an upward projected stub engaged into a hole on said lower portion of said pressing plate and at a lower side with two downward extended projections that together define between them an engaging slot having a width corresponding to that of said interface card for fitly receiving a top of said interface card therein.

4. A structure for adjustably pressing interface cards against card slots as claimed in claim 1, wherein each said adjusting means includes a nut received in one said through hole in said adjusting channel on said main support and an adjusting screw downward threaded through said nut.

5. A structure for adjustably pressing interface cards against card slots as claimed in claim 1, further comprising a cooling fan mounted on said main support through said adjusting means.

* * * * *